United States Patent [19]

Liu et al.

[11] 4,181,755

[45] Jan. 1, 1980

[54] THIN FILM PATTERN GENERATION BY AN INVERSE SELF-LIFTING TECHNIQUE

[75] Inventors: Shing-Gong Liu, Princeton; Ferdinand C. Duigon, East Brunswick, both of N.J.

[73] Assignee: RCA Corporation, New York, N.Y.

[21] Appl. No.: 962,719

[22] Filed: Nov. 21, 1978

[51] Int. Cl.² .................. B05D 5/12; H01L 29/48; H01L 31/18
[52] U.S. Cl. .................. 430/314; 430/329; 156/659.1; 204/192 D; 427/84; 427/88; 427/89; 427/93; 427/94; 427/95; 427/96; 427/99; 427/125; 427/126; 427/259; 427/75
[58] Field of Search .............. 427/259, 75, 84, 88, 427/89, 93–95, 96, 99, 125, 126; 156/659; 96/36, 362; 204/192 D

[56] References Cited

U.S. PATENT DOCUMENTS

| | | | |
|---|---|---|---|
| 2,559,389 | 7/1951 | Beeber | 427/259 |
| 2,728,693 | 12/1955 | Cado. | |
| 3,443,915 | 5/1969 | Wood et al. | |
| 3,498,833 | 3/1970 | Lehrer | 427/259 |
| 3,526,555 | 9/1970 | Alexander. | |
| 3,617,373 | 11/1971 | Mott | 204/192 |
| 3,627,598 | 12/1971 | McDonald. | |
| 3,873,361 | 3/1975 | Franco et al. | 427/88 |
| 3,985,597 | 10/1976 | Zielinski | 427/90 |
| 4,004,044 | 1/1977 | Franco et al. | 427/259 |
| 4,045,594 | 8/1977 | Maddocks | 427/90 |
| 4,076,575 | 2/1978 | Chang | 427/259 |
| 4,090,006 | 5/1978 | Havas et al. | 427/89 |
| 4,108,717 | 8/1978 | Widmann | 427/259 |
| 4,115,120 | 9/1978 | Dyer et al. | 96/36 |
| 4,132,586 | 1/1979 | Schaible et al. | 156/659 |

FOREIGN PATENT DOCUMENTS

51-32489 3/1976 Japan ........................... 427/259

OTHER PUBLICATIONS

Fredericks et al., "Polysulfone Lift–Off Masking Technique" IBM Tech. Dis. Bulletin, vol. 20, No. 3, 1977.
Bergeron, "Double Lift–Off via Interconnection and Passivation Process" IBM Tech. Dis. Bulletin, vol. 21, No. 4, Sep. (1978).
Dalal et al., "Chrome–Copper–Chrome Lift–Off Process" IBM Tech. Dis. Bulletin, vol. 20, No. 8, Jan. 1978.

*Primary Examiner*—John D. Smith
*Attorney, Agent, or Firm*—Harold Christoffersen; Donald S. Cohen; Kenneth R. Glick

[57] ABSTRACT

A method of pattern generating a circuit film and adjacent barrier film on a substrate. A continuous layer of circuit film is applied to the substrate surface, and a photoresist pattern is delineated on the circuit film such that the photoresist remains on the circuit film pattern area. The area of circuit film not covered by photoresist is then removed, exposing the substrate surface. While retaining the photoresist which covers the circuit film pattern, the entire substrate surface is coated with the barrier film. The remaining photoresist is then removed, causing the barrier film which covers it to lift off, thereby exposing the circuit film pattern.

10 Claims, 5 Drawing Figures

THIN FILM PATTERN GENERATION BY AN INVERSE SELF-LIFTING TECHNIQUE

BACKGROUND OF THE INVENTION

This invention relates to the fabrication of thin film devices on semiconductor substrates, and more particularly to the fabrication of devices comprising a patterned circuit film which is adjacent to a film of some other material, hereinafter referred to as the barrier film. Devices such as Schottky barrier diodes and solar cells can be fabricated in the manner which will be described herein.

In the case of a Schottky diode, the barrier film is a dielectric material such as silicon dioxide, and it performs a passivation function. In the case of a solar cell device, the barrier film serves the purpose of an antireflective coating, and can be made of any appropriate material.

In either case, the requirements of a functional device are that both films be adherent to the substrate, that the circuit film be precisely defined, and that the barrier film be in intimate contact with the circuit film at the circuit film/barrier film interface. Film adherence is required to ensure circuit reliability. Precise circuit film pattern definition is important for proper electrical characteristics as well as for providing an accurate base for further processing. Intimate contact between the two films ensures passivation at the circuit film/substrate junction boundaries of Schottky diodes, and increases the efficiency of solar cell devices by achieving complete coverage of the antireflective coating.

In the field of semiconductor fabrication a conventional method for creating a circuit film/barrier film pattern on a substrate consists of depositing a continuous layer of barrier film, pattern generating a photoresist pattern on its surface, etching the barrier film in the areas not protected by photoresist, and depositing circuit film in the areas from which the barrier film was removed. This technique, however, can create at least two significant problems, both relating to the etching of the barrier layer. It is the selective etching of the barrier film that defines the circuit film pattern areas. Therefore, any undercutting of the photoresist which covers the barrier film, a common occurrence because of the thickness and etch time involved, will result in an imprecisely defined circuit film pattern. Furthermore, the circuit film might be poorly adherent because it is deposited on areas of the substrate which were previously coated with barrier film and which might still contain some barrier film residues.

A second conventional technique for semiconductor fabrication eliminates the two aforementioned problems, but creates others. This second technique, referred to as self-lifting, involves delineating a photoresist pattern on the substrate surface, coating it with the circuit film, and stripping the photoresist, using the photoresist to lift the circuit film overlying it. To define the barrier film in the area surrounding the circuit film pattern, the entire surface of the circuit film and exposed substrate is coated with the barrier film. The barrier film is then stripped from the surface of the circuit film, an operation which requires additional processing, and has some inherent problems.

To selectively remove the barrier film from the surface of the circuit film pattern generally requires additional photolithographic steps. This processing creates potential photomask alignment problems which, if present, will ultimately lead to non-intimate contact between the circuit film and the barrier film which remains. This additional photographic processing is obviated by the present invention. Even if photolithographic methods are not used, additional processing of some sort would be required to remove the barrier film. Furthermore, incomplete removal of the barrier film, regardless of the technique used, can create difficulties in further processing (eg/bonding) of the device.

SUMMARY OF THE INVENTION

A continuous layer of circuit film is applied to a surface of a substrate, and a photoresist pattern coincident with the ultimately desired circuit film pattern is defined on the surface of the circuit film. The portion of the circuit film not covered by photoresist is then removed. While retaining the photoresist on the remaining circuit film, the entire surface of the substrate is coated with a barrier film. The photoresist is then stripped from the surface of the circuit film, causing the barrier film to lift off the photoresist, and the circuit film to be exposed.

DETAILED DESCRIPTION

Figure 1:
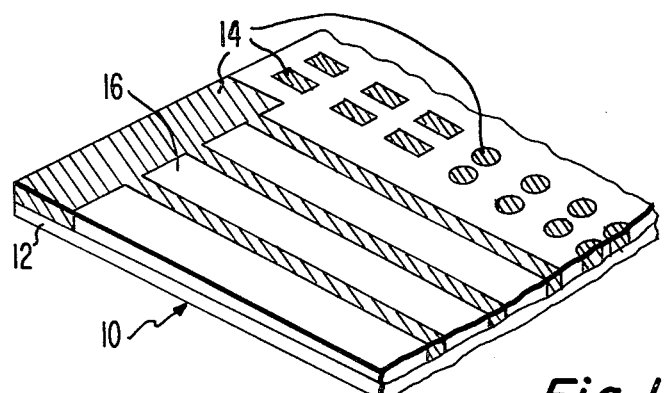
FIG. 1 is a perspective view of a portion of an illustrative thin film device, embodying a circuit film pattern surrounded by a barrier film pattern.

Referring to FIG. 1, a portion of a typical thin-film device 10 which can be manufactured in accordance with the invention is illustrated. The device includes a substrate 12 on which areas of circuit film pattern 14, and adjacent barrier film pattern 16 have been generated. The composition of the circuit film, the barrier film, or the substrate can each be any combination of conductive, dielectric, or semiconducting materials.

In one specific example, a Schottky barrier diode can be manufactured wherein the substrate 12 material is an appropriately doped semiconductor material, the circuit film pattern 14 is a conductor, and the barrier film pattern 16 is a passivation material. In such an example, the substrate 12 might comprise a material with a top layer of N-type conductivity over a layer of N+ type conductivity, the circuit film pattern 14 might consist of any metal or combination of metals applied so as to create a barrier junction, and the barrier film pattern 16 might be a plasma deposited oxide or nitride such as $SiO_2$ or $Si_3N_4$, respectively.

In a second specific example, a solar cell can be fabricated wherein the substrate 12 is an appropriately doped semiconductor material, the circuit film pattern 14 is a conductor, and the barrier film pattern 16 is an antireflective coating of any combination of conducting, semiconducting, or dielectric materials. In such an example, the substrate 12 might be a semiconductor material which is sensitive to solar energy, the circuit film pattern 14 might consist of any metal or combination of metals applied so as to create an ohmic contact, and the barrier film pattern 16 would be some substance which is essentially transparent to a desired portion of the solar spectrum.

Figure 2A:
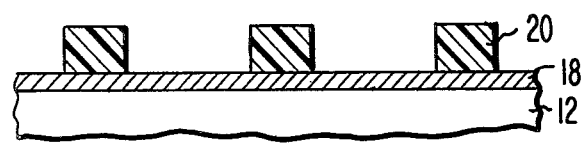
FIGS. 2A–2D depict simplified cross-sectional views of the thin film device as it proceeds through the fabrication sequence.

FIG. 2A represents a simplified cross-sectional view of the device after a photoresist pattern generation step.

Prior to the stage illustrated in FIG. 2A, circuit film material 18 is uniformly applied across the substrate surface, and photoresist 20 is applied and selectively removed so as to yield a particular pattern. These thin film deposition and pattern generation techniques are commonly known and used throughout the semiconductor industry. The pattern of the photoresist 20 remaining on the circuit film material 18 corresponds to the pattern of the circuit film ultimately desired.

Figure 2B:
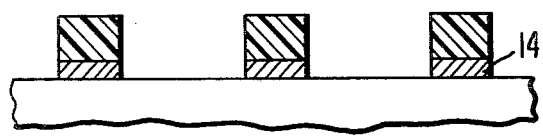

FIG. 2B illustrates the device after the circuit film material 18 has been delineated in the pattern of the photoresist 20 so as to yield the circuit film pattern 14. The circuit film material 18 has been removed in all areas not covered with photoresist 20. This removal can be achieved by ion beam milling or chemical etching techniques commonly known and used in the semiconductor industry.

Figure 2C:
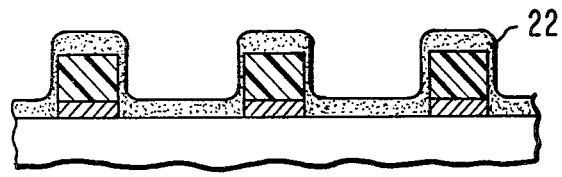

FIG. 2C illustrates the device after deposition of the barrier film 22. When the barrier film 22 is a material such as $SiO_2$, $Si_3N_4$, $TiO_2$, $Ta_2O_5$, $Al_2O_3$ or AlN, it can be deposited by a variety of well known vacuum, plasma, or chemical vapor deposition techniques.

Figure 2D:
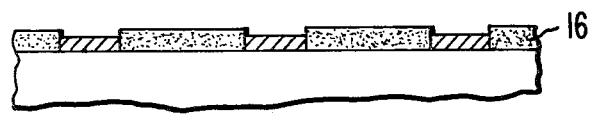

After the barrier film 22 has been deposited, the photoresist 20 remaining on the circuit film pattern 14 is removed. Stripping the photoresist layer at this time causes the barrier film which was covering it to lift off. The result is the device illustrated in FIG. 2D. This stripping can be achieved, for example, by soaking the device in an appropriate photoresist solvent, and can be further facilitated by agitating the solvent.

The process herein described utilizes a single pattern generated photoresist layer 20 as both an etch mask for an underlying layer, and a lifting material for an overlying layer. Furthermore, the present invention eliminates the circuit film/substrate adherence problems which may occur when conventional processing techniques are used. As previously indicated, conventional processing techniques present the possibility that incomplete removal (from circuit film pattern regions) of previously applied barrier film or photoresist will create subsequent circuit film adherence problems. In the present process, the circuit film material 18 is adherent because it is applied to a "clean" substrate. Since the circuit film application precedes the photoresist 20 and barrier film 22 depositions, there is no opportunity for photoresist or barrier film residues to be formed between the substrate 12 and the circuit film material 18.

In addition, the present invention achieves intimate contact along the interface of the circuit film pattern 14 and the barrier film pattern 16; a desirable feature from several standpoints.

In the case of a solar cell, a well defined interface means there is complete coverage of the antireflective barrier film in all areas not covered with circuit film. This complete coverage makes optimum use of the antireflective material, in that all sunlight impinging upon the barrier film pattern 16 areas must travel through this antireflective coating in order to reach the semiconductor substrate 12 surface.

In the case of any device which utilizes the circuit film/semiconductor junction for its electrical properties, a well defined interface is also desirable. Since the barrier film pattern 16 in such a device performs a passivation function, it is desirable that at the plane of the junction, the boundary of the barrier film pattern 16 coincide with the boundary of the circuit film pattern 14. This intimate contact is accomplished in the present invention because the boundary surface of the circuit film pattern 14 is exposed when the barrier film 22 is initially deposited.

What is claimed is:

1. A method of generating a predetermined pattern of electrically conductive circuit film and an intimately adjacent dielectric barrier film on a substrate, comprising the steps of:
    (a) applying a layer of circuit film material on a surface of the substrate;
    (b) generating a photoresist pattern on the circuit film material, the photoresist being coincident with the predetermined circuit film pattern;
    (c) removing those portions of the circuit film material which are not covered with photoresist, to form the circuit film pattern on the surface of the substrate;
    (d) depositing a continuous layer of barrier film on the surface of the substrate and the circuit film pattern such that the barrier film is in intimate contact with that portion of the circuit film not covered by photoresist; and
    (e) removing the photoresist remaining on the circuit film pattern so that the barrier film covering the photoresist lifts off, thereby exposing the circuit film pattern.

2. A method in accordance with claim 1 wherein the barrier film is an antireflective material which is essentially transparent to a portion of the solar spectrum.

3. A method of claim 1 wherein the circuit film material is comprised of a first layer on the surface of the substrate, a second layer overlying the first layer, and a third layer overlying the second layer, wherein the first layer material is selected from a group consisting of Ti, Cr, Mo, and a Au-Ge alloy, the second layer material is selected from a group consisting of Pt, Pd, and Ni, and the third layer material is Au.

4. A method of claim 1 wherein the circuit film material is comprised of a first layer on the surface of the substrate, and a second layer overlying the first layer, wherein the first layer material is selected from a group consisting of Cr, Ti, and Mo, and the second layer material is Au.

5. A method of claim 1 wherein the circuit film material is Al.

6. A method in accordance with claim 1 wherein the circuit film pattern is comprised of a plurality of essentially uniformly spaced lines which are interconnected.

7. A method in accordance with claim 1 wherein the circuit film pattern is comprised of a plurality of isolated areas for use as electrodes on Schottky barrier diodes.

8. A method in accordance with claim 1 wherein the barrier film is selected from a group consisting of $SiO_2$, $Si_3N_4$, $TiO_2$, $Ta_2O_5$, $Al_2O_3$, and AlN.

9. A method in accordance with claim 1 wherein the barrier film is deposited by plasma deposition techniques.

10. A method in accordance with claim 1 wherein the barrier film is deposited by a chemical vapor deposition technique.

* * * * *